(12) United States Patent
Lapujade

(10) Patent No.: US 11,059,418 B2
(45) Date of Patent: Jul. 13, 2021

(54) MULTI-MODE NVIS-COMPATIBLE LIGHTING SYSTEM

(71) Applicant: GOODRICH LIGHTING SYSTEMS, INC., Oldsmar, FL (US)

(72) Inventor: Philippe Lapujade, Chandler, AZ (US)

(73) Assignee: Goodrich Lighting Systems, Inc., Oldsmar, FL (US)

( * ) Notice: Subject to any disclaimer, the term of this patent is extended or adjusted under 35 U.S.C. 154(b) by 80 days.

(21) Appl. No.: 16/363,956

(22) Filed: Mar. 25, 2019

(65) Prior Publication Data

US 2020/0307449 A1    Oct. 1, 2020

(51) Int. Cl.

| | |
|---|---|
| B60Q 3/43 | (2017.01) |
| B60Q 3/60 | (2017.01) |
| B64D 11/00 | (2006.01) |
| F21V 3/00 | (2015.01) |
| F21V 15/01 | (2006.01) |
| F21Y 105/16 | (2016.01) |
| F21Y 113/13 | (2016.01) |
| F21Y 115/10 | (2016.01) |
| F21W 107/30 | (2018.01) |
| F21W 106/00 | (2018.01) |

(52) U.S. Cl.
CPC .............. B60Q 3/43 (2017.02); B60Q 3/60 (2017.02); B64D 11/00 (2013.01); F21V 3/00 (2013.01); F21V 15/01 (2013.01); B64D 2011/0038 (2013.01); F21W 2106/00 (2018.01); F21W 2107/30 (2018.01); F21Y 2105/16 (2016.08); F21Y 2113/13 (2016.08); F21Y 2115/10 (2016.08)

(58) Field of Classification Search
None
See application file for complete search history.

(56) References Cited

U.S. PATENT DOCUMENTS

| | | |
|---|---|---|
| 6,513,937 B1 | 2/2003 | Dehmlow |
| 6,758,586 B1 | 7/2004 | Wilhem et al. |
| 6,786,617 B2 | 9/2004 | Lemay et al. |
| 7,118,261 B2 | 10/2006 | Fredericks et al. |
| 7,525,611 B2 | 4/2009 | Zagar et al. |

(Continued)

OTHER PUBLICATIONS

European Patent Office, European Search Report dated Jul. 10, 2020 in Application No. 19211462.7.

*Primary Examiner* — Elmito Breval
(74) *Attorney, Agent, or Firm* — Snell & Wilmer L.L.P.

(57) ABSTRACT

The present disclosure provides a night vision imaging system (NVIS) lighting system, comprising a frame comprising a first light source, a second light source adjacent to the first light source, a third light source adjacent to the second light source, and a diffuser mounted to the frame and encasing the first light source, the second light source, and the third light source. The first light source may comprise a first dominant wavelength, the second light source may comprise a second dominant wavelength different from the first dominant wavelength, and the third light source may comprise a third dominant wavelength different from the first dominant wavelength and the second dominant wavelength. Light emitted from the first light source, the second light source, and the third light source may be blended to generate a first blended light source comprising a first target output color.

17 Claims, 5 Drawing Sheets

(56) References Cited

U.S. PATENT DOCUMENTS

| | | |
|---|---|---|
| 7,843,642 B2 | 11/2010 | Shaoulov et al. |
| 2004/0145893 A1 | 7/2004 | Lemay et al. |
| 2004/0170014 A1* | 9/2004 | Pritchard .............. F21V 15/015 362/202 |
| 2005/0128759 A1* | 6/2005 | Fredericks ............. B64D 47/06 362/470 |
| 2005/0231946 A1* | 10/2005 | Guthrie ................. H01H 9/181 362/231 |
| 2005/0237737 A1* | 10/2005 | Kim ....................... F21L 4/027 362/197 |
| 2009/0154194 A1 | 6/2009 | Hadlich et al. |
| 2010/0002440 A1 | 1/2010 | Negley et al. |
| 2010/0270567 A1 | 10/2010 | Emerson et al. |
| 2013/0188345 A1* | 7/2013 | Schmid ................. B64D 47/02 362/231 |
| 2017/0284630 A1* | 10/2017 | Sergenese ............. F21V 23/004 |
| 2018/0141663 A1 | 5/2018 | Hessling-Von Heimendahl et al. |

\* cited by examiner

MULTI-MODE NVIS-COMPATIBLE LIGHTING SYSTEM

FIELD OF THE DISCLOSURE

The present disclosure relates to aircraft lighting systems, and more particularly, to lighting systems for aircraft night vision imaging systems.

BACKGROUND OF THE DISCLOSURE

Certain aircraft may contain night vision imaging systems (NVISs) compatible lighting equipment, allowing aircraft personnel to utilize NVIS goggles to conduct tasks at night. Conventional NVISs compatible lighting commonly utilize a white light source (for example, incandescent, halogen, or LED) in combination with one or more optical filters that remove certain unwanted wavelengths of light, while maintaining the target color. However, such optical filters may be expensive, increase manufacturing times, and result in light loss as the light moves through the optical filters.

SUMMARY OF THE DISCLOSURE

A night vision imaging system (NVIS) lighting system may comprise a frame comprising a first light source, a second light source adjacent to the first light source, a third light source adjacent to the second light source, and a diffuser mounted to the frame and encasing the first light source, the second light source, and the third light source, wherein the first light source comprises a first dominant wavelength, the second light source comprises a second dominant wavelength different from the first dominant wavelength, and the third light source comprises a third dominant wavelength different from the first dominant wavelength and the second dominant wavelength, and wherein light emitted from the first light source, the second light source, and the third light source is blended to generate a first blended light source comprising a first target output color.

In various embodiments, light emitted from the first light source, the second light source, and the third light source may be blended to generate the second blended light source comprising a second target output color. The first light source and the second light source may each be below a defined maximum NVIS radiance value. The first dominant wavelength of the first light source may correspond to a blue color, the second dominant wavelength of the second light source may correspond to a green color, and the third dominant wavelength of the third light source may correspond to an amber color. The first target output color may comprise a green color comprising a dominant wavelength of between approximately 530 nm and approximately 540 nm. The second target output color may comprise a white color comprising any wavelength between approximately 390 nm and approximately 700 nm. The first light source may comprise a visual proportional output of approximately 34%, the second light source may comprise a visual proportional output of approximately 28%, and the third light source may comprise a visual proportional output of approximately 38%. The first light source may comprise a visual proportional output of approximately 17%, the second light source may comprise a visual proportional output of approximately 73%, and the third light source may comprise a visual proportional output of approximately 10%.

A light-emitting diode (LED) array may comprise a first LED, a second LED, and a third LED, wherein the LED array may be configured to be encased within a diffuser and wherein the first LED comprises a first dominant wavelength, the second LED comprises a second dominant wavelength different from the first dominant wavelength, and the third LED comprises a third dominant wavelength different from the first dominant wavelength and the second dominant wavelength, and wherein light emitted from the first LED, the second LED, and the third LED is blended to generate a first blended light source comprising a first target output color.

In various embodiments, light emitted from the first LED, the second LED and the third LED may be blended to generate a second blended light source comprising a second target output color. The first LED, the second LED, and the third LED may be aligned in a column, the second LED being situated between the first LED and the third LED. The first LED, the second LED, and the third LED may be aligned in a first row, the second LED being situated between the first LED and the third LED. The LED array may further comprise a fourth LED, a fifth LED, and a sixth LED, wherein the fourth LED, the fifth LED, and the sixth LED are aligned in a second row adjacent to the first LED, the second LED, and the third LED. The fourth LED may be situated between the fifth LED and the sixth LED. The first dominant wavelength may correspond to a blue color, the second dominant wavelength may correspond to a green color, and the third dominant wavelength may correspond to an amber color. The first target output color may comprise a green color comprising a dominant wavelength of between approximately 530 nm and approximately 540 nm. The second target output color may comprise a white color comprising any wavelength between approximately 390 nm and approximately 700 nm.

A method of producing a target output color for a night vision imaging system (NVIS), may comprise identifying the target output color comprising a maximum NVIS radiance value, providing a first light source comprising a first dominant wavelength, providing a second light source comprising a second dominant wavelength, providing a third light source comprising a third dominant wavelength, and emitting light from the first light source, the second light source, and the third light source to achieve a blended light source comprising the target output color below the maximum NVIS radiance value.

In various embodiments, the target output color may comprise a first target output color or a second target output color different from the first target output color. The first dominant wavelength may correspond to a blue color, the second dominant wavelength may correspond to a green color, and the third dominant wavelength may correspond to an amber color.

The foregoing features and elements may be combined in various combinations without exclusivity, unless expressly indicated otherwise. These features and elements as well as the operation thereof will become more apparent in light of the following description and the accompanying drawings. It should be understood, however, the following description and drawings are intended to be exemplary in nature and non-limiting.

BRIEF DESCRIPTION OF THE DRAWINGS

The accompanying drawings are included to provide a further understanding of the present disclosure and are incorporated in, and constitute a part of, this specification, illustrate various embodiments, and together with the description, serve to explain the principles of the disclosure.

DETAILED DESCRIPTION

The detailed description of various embodiments herein makes reference to the accompanying drawings, which show various embodiments by way of illustration. While these various embodiments are described in sufficient detail to enable those skilled in the art to practice the disclosure, it should be understood that other embodiments may be realized and that logical, chemical, electrical, and mechanical changes may be made without departing from the spirit and scope of the disclosure. Thus, the detailed description herein is presented for purposes of illustration only and not of limitation.

For example, the steps recited in any of the method or process descriptions may be executed in any order and are not necessarily limited to the order presented. Furthermore, any reference to singular includes plural embodiments, and any reference to more than one component or step may include a singular embodiment or step. Also, any reference to attached, fixed, connected, or the like may include permanent, removable, temporary, partial, full, and/or any other possible attachment option. Additionally, any reference to without contact (or similar phrases) may also include reduced contact or minimal contact.

For example, in the context of the present disclosure, methods, systems, and articles may find particular use in connection with aircraft NVISs. However, various aspects of the disclosed embodiments may be adapted for performance in a variety of other systems. As such, numerous applications of the present disclosure may be realized.

It may be desirable for NVISs to achieve a specific target color for a given application, while maintaining the NVIS radiance of such light source below a threshold value. In various embodiments, lighting systems are provided herein capable of achieving one or more targeted colors without exceeding the threshold NVIS radiance and without the use of optical filters.

Figure 1:
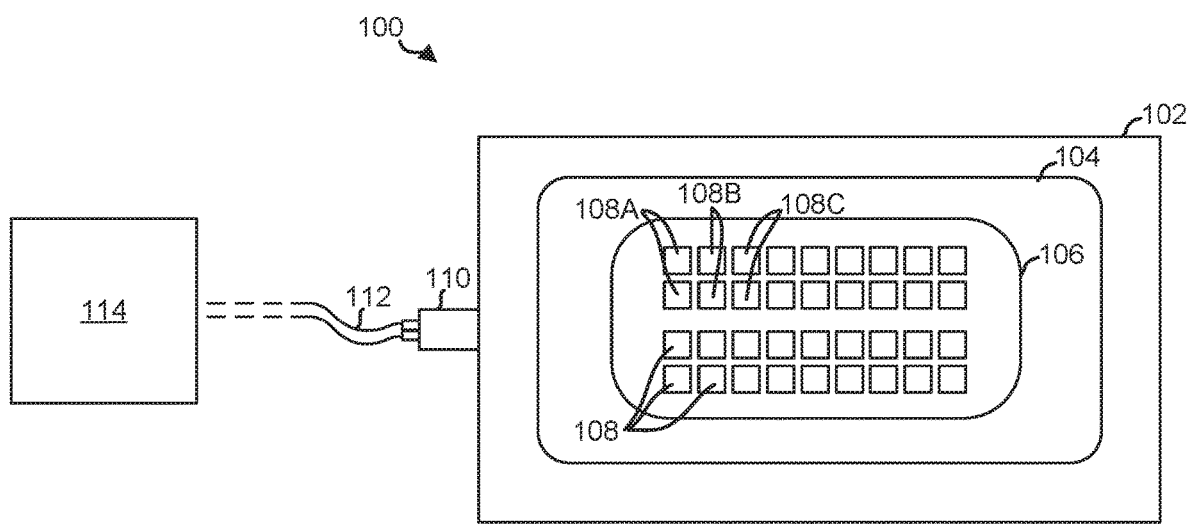
FIG. 1 illustrates a multi-mode NVIS-compatible lighting system, in accordance with various embodiments.

Accordingly, with reference to FIG. 1, a multi-mode NVIS-compatible lighting system 100 is illustrated, in accordance with various embodiments. Multi-mode NVIS-compatible lighting system 100 may comprise a frame 102 comprising any suitable material, for example a metal, metal alloy, composite, or polymer material, in various embodiments. Frame 102 may comprise a housing for various electronic components such as a plurality of light sources 108 such as light emitting diodes (LEDs) distributed on a substrate such as a printed circuit board. Multi-mode NVIS-compatible lighting system 100 may comprise a power source 114 configured to provide power for the various electronic components in frame 102. For example, frame 102 may be coupled to power source 114 via a power line 112 connected to a plug 110, which may mate with a socket formed in frame 102. Frame 102 may provide a protective barrier for such electronic components and may provide a structure to mount such electronic components to a desired component. Frame 102 may be configured to be mounted within an aircraft and may provide lighting for various components, including navigational screens or other components within the cockpit, for example.

Multi-mode NVIS-compatible lighting system 100 may further comprise an optical diffuser 104 mounted to frame 102 and encasing one or more light sources 108. Optical diffuser 104 may comprise a semi-opaque material configured to evenly distribute light from the one or more light sources, thereby reducing areas of relative brightness and dimness. Optical diffuser 104 may be mounted to frame 102 and encase the one or more light sources 108 and evenly distribute light from the one or more light sources 108 through window 106. In various embodiments, optical diffuser 104 may be mounted to frame 102 via a flange comprising one or more apertures configured to receive an equal number of fasteners.

In various embodiments, light sources 108 may comprise LEDs, however, light sources 108 are not limited in this regard and may comprise other light sources with relatively narrow spectral emission. Light sources 108 may comprise any suitable shape and/or power of LED. For example, light sources 108 may comprise a candle LED, a general lighting services LED, a golf ball LED, a reflector LED, a spotlight LED, or a tube LED, in various embodiments. Light sources 108 may comprise an LED comprising any suitable wattage capable of ensuring the NVIS radiance of light sources 108 is maintained below a threshold value, including an LED between 1 mW and 30 W, for example.

Multi-mode NVIS-compatible lighting system 100 may comprise any number of light sources 108. For example, multi-mode NVIS-compatible lighting system may comprise between 1 and 100 LEDs, between 1 and 50 LEDs, or between 1 and 20 LEDs in various embodiments. In various embodiments, multi-mode NVIS-compatible lighting system 100 may comprise one or more types of light sources 108 and/or colors of light sources 108. For example, multi-mode NVIS-compatible lighting system 100 may comprise a first light source 108A, a second light sources 108B, and a third light source 108C. Multi-mode NVIS-compatible lighting system 100 is not limited in this regard and may comprise more than three types of light sources 108 and/or colors of light sources 108.

First light source 108A, second light source 108B, and third light source 108C may comprise any suitable color. For example, first light source 108A, second light source 108B, and third light source 108C may comprise one of white, silver, grey, black, navy, blue, cerulean, sky blue, turquoise, blue-green, azure, teal, cyan, green, lime, chartreuse, olive, yellow, gold, amber, orange, brown, orange-red, red, maroon, rose, red-violet, pink, magenta, purple, blue-violet, indigo, violet, peach, apricot, ochre, plum, or any suitable combination of the above. First light source 108A may comprise a first color, second light source 108B may comprise a second color different than the first color, and third light source 108C may comprise a third color different than the first color and the second color. In various embodiment, first light source 108A may comprise a blue color, second light source 108B may comprise a green color, and third light source 108C may comprise an amber color.

Multi-mode NVIS-compatible lighting system 100 may be configured such that the light emitted from first light source 108A, second light source 108B, and third light source 108C may be blended to achieve a target output color. For example, in various embodiments, the light emitted from first light source 108A, second light source 108B, and third light source 108C may be blended to achieve a target output color such as those set forth in government standards, such as NVIS Green A, NVIS Green B, and/or NVIS White. Such standards may be found in the Department of Defense Interface Standard, entitled *Lighting, Aircraft, Night Vision Imaging System (NVIS) Compatible*. However, such target colors also fall below set NVIS radiance values. Maximum NVIS radiance values for NVIS White lights may be $1.0 \times 10^{-9}$ NRa at 0.1 fL, while maximum NVIS radiance values for NVIS Green A lights may be $1.7 \times 10^{-10}$ NRa at 0.1 fL, wherein the units "fL" may refer to footlamberts, a unit of luminance. In various embodiments, NVIS White lights and NVIS Green A lights may be used for applications such as utility, map, work, and inspection lights used in NVISs.

Figure 3:
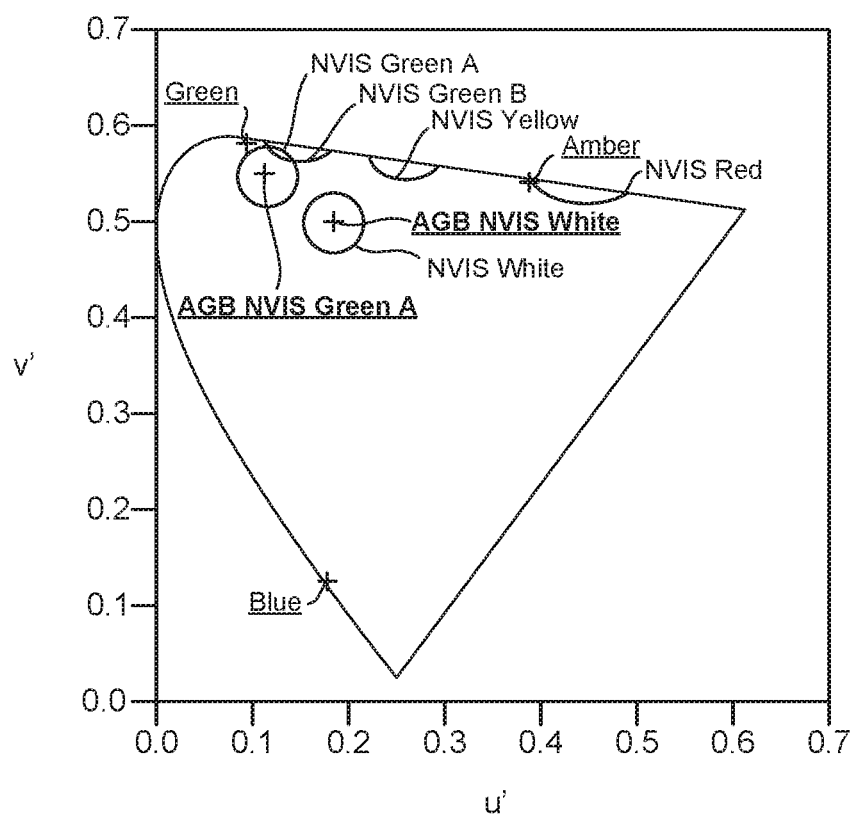
FIG. 3 illustrates a chromaticity diagram of output colors produced by a multi-mode NVIS-compatible lighting system, in accordance with various embodiments.

In various embodiments, in order to achieve an output target color, first light source 108A, second light source 108B, and third light source 108C may be adjusted according to their visual proportional output. For example, with momentary reference to FIG. 3, a u'-v' chromaticity diagram of output colors produced by multi-mode NVIS-compatible lighting system 100 is illustrated, in accordance with various embodiments, first light source 108A may comprise a blue color, second light source 108B may comprise a green color, and third light source 108C may comprise an amber color. By varying the visual proportional outputs as measured by the luminance of first light source 108A, second light source 108B, and third light source 108C, various output colors may be achieved. As can be seen in FIG. 3, government standards may define various regions for what may qualify as NVIS Green A, NVIS Green B, NVIS Yellow, NVIS White, and NVIS Red (as indicated by the circular regions). By varying the visual proportional output of first light source 108A, second light source 108B, and third light source 108C, multi-mode NVIS-compatible lighting system 100 may achieve a target output color of NVIS White and/or NVIS Green A, for example.

Specifically, in various embodiments, to achieve a target output color within the area defined by the NVIS White circle (as indicated by point labeled AGB NVIS White), the visual proportional output of first light source 108A (blue) may be approximately 34%, the visual proportional output of second light source 108B (green) may be approximately 28%, and the visual proportional output of third light source 108C (amber) may be approximately 38%, with a total measured NVIS radiance of $0.8 \times 10^{-9}$ NRa at 0.1 fL. Likewise, to achieve a target output color within the area defined by the NVIS Green A circle (as indicated by point labeled AGB NVIS Green A), the visual proportional output of first light source 108A (blue) may be approximately 17%, the visual proportional output of second light source 108B (green) may be approximately 73%, and the visual proportional output of third light source 108C (amber) may be approximately 17%, with a total measured NVIS radiance of $6.0 \times 10^{-11}$ NRa at 0.1 fL. However, as would be appreciated by one of ordinary skill in the art, other combinations of light source colors at other visual output proportions may be utilized to achieve other target colors and NVIS Radiance.

Returning to FIG. 1, light sources 108 may be oriented in any suitable configuration capable of sufficiently blending light emitted from light sources 108. For example, light sources 108 may be arranged in an array which may allow first light source 108A, second light source 108B, and third light source 108C to sufficiently blend to achieve a target output color. In the embodiment illustrated in FIG. 1, light sources 108 may be arranged in array having one or more rows and one or more columns. A plurality of first light sources 108A may form a first column, a plurality of second light sources 108B may form a second column, and a plurality of third light sources 108C may form a third column. The plurality of second light sources 108B in the second column may be positioned between the plurality of first light sources 108A in the first column and the plurality of third light sources 108C in the third column. This configuration may be repeated, thereby achieving an array of alternating columns of first light sources 108A, second light sources 108B, and third light sources 108C. Such a configuration may allow light emitted from first light source 108A, second light source 108B, and third light source 108C to adequately blend to achieve the target output color.

Figure 2A:
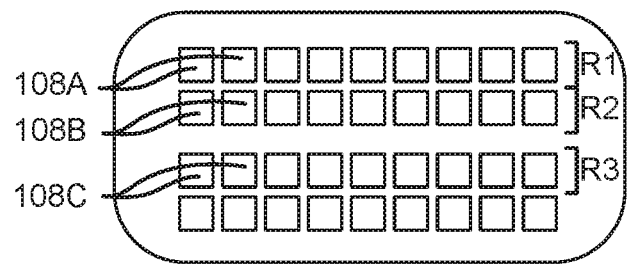
FIGS. 2A, 2B and 2C illustrate schematic diagrams of various LED arrangements of a multi-mode NVIS-compatible lighting system, in accordance with various embodiments.

In the embodiment illustrated in FIG. 2A, light sources 108 may be arranged in array having one or more rows and one or more columns. A plurality of first light sources 108A may form a first row R1, a plurality of second light sources 108B may form a second row R2, and a plurality of third light sources 108C may form a third row R3. The plurality of second light sources 108B in the second row R2 may be positioned between the plurality of first light sources 108A in the first row R1 and the plurality of third light sources 108C in the third row R3. This configuration may be repeated, thereby achieving an array of alternating rows of first light sources 108A, second light sources 108B, and third light sources 108C. Such a configuration may allow light emitted from first light source 108A, second light source 108B, and third light source 108C to adequately blend to achieve the target output color.

Figure 2B:
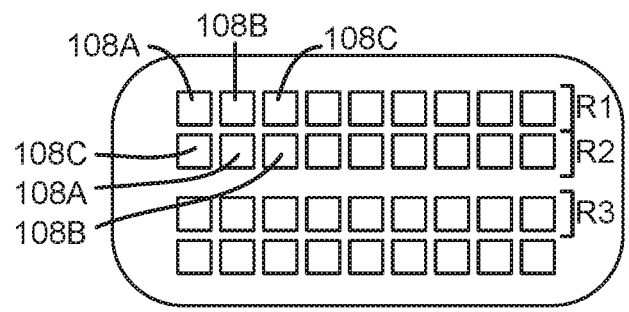

In the embodiment illustrated in FIG. 2B, light sources 108 may be arranged in array having one or more rows and one or more columns. In the first row R1 (and from left to right), a plurality of first light sources 108A, a plurality of second light sources 108B, and a plurality of third light sources 108C may alternate in that order. In the second row R2 (and from left to right), the plurality of third light sources 108C, the plurality of first light sources 108A, and the plurality of second light sources 108B may alternate in that order. As such, an arrangement of first light sources 108A, second light sources 108B, and third light sources 108C may be mixed throughout rows and columns. Such a configuration may allow light emitted from first light source 108A, second light source 108B, and third light source 108C to adequately blend to achieve the target output color.

Figure 2C:
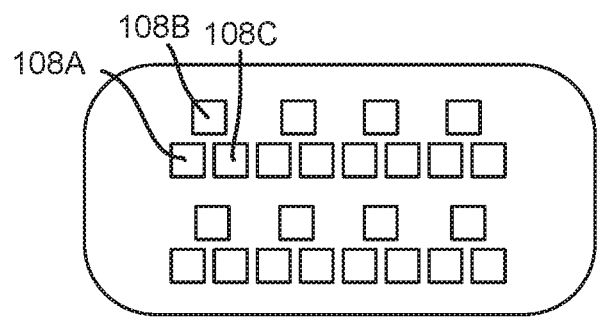

In the embodiment illustrated in FIG. 2C, the plurality of first light sources 108A, the plurality of second light sources 108B, and the plurality of third light sources 108C may be arranged in array of any suitable shape. For example, in the embodiment illustrated in FIG. 2C, the light sources 108 may be arranged in a triangular geometry, with each triangular geometry comprising at least one first light source 108A, at least one second light source 108B, and at least one third light source 108C. Such a configuration may allow light emitted from first light source 108A, second light source 108B, and third light source 108C to adequately blend to achieve the target output color. As would be appreciated by one of ordinary skill in the art, the arrangements of first light source 108A, second light source 108B, and third light source 108C of multi-mode NVIS-compatible lighting system 100 are not limited to those arrangements illustrated in FIG. 1. through FIG. 2C, and multi-mode NVIS-compatible lighting system 100 may comprise any suitable arrangement of first light source 108A, second light source 108B, and third light source 108C sufficient to blend light emitted from light sources 108.

Figure 4:
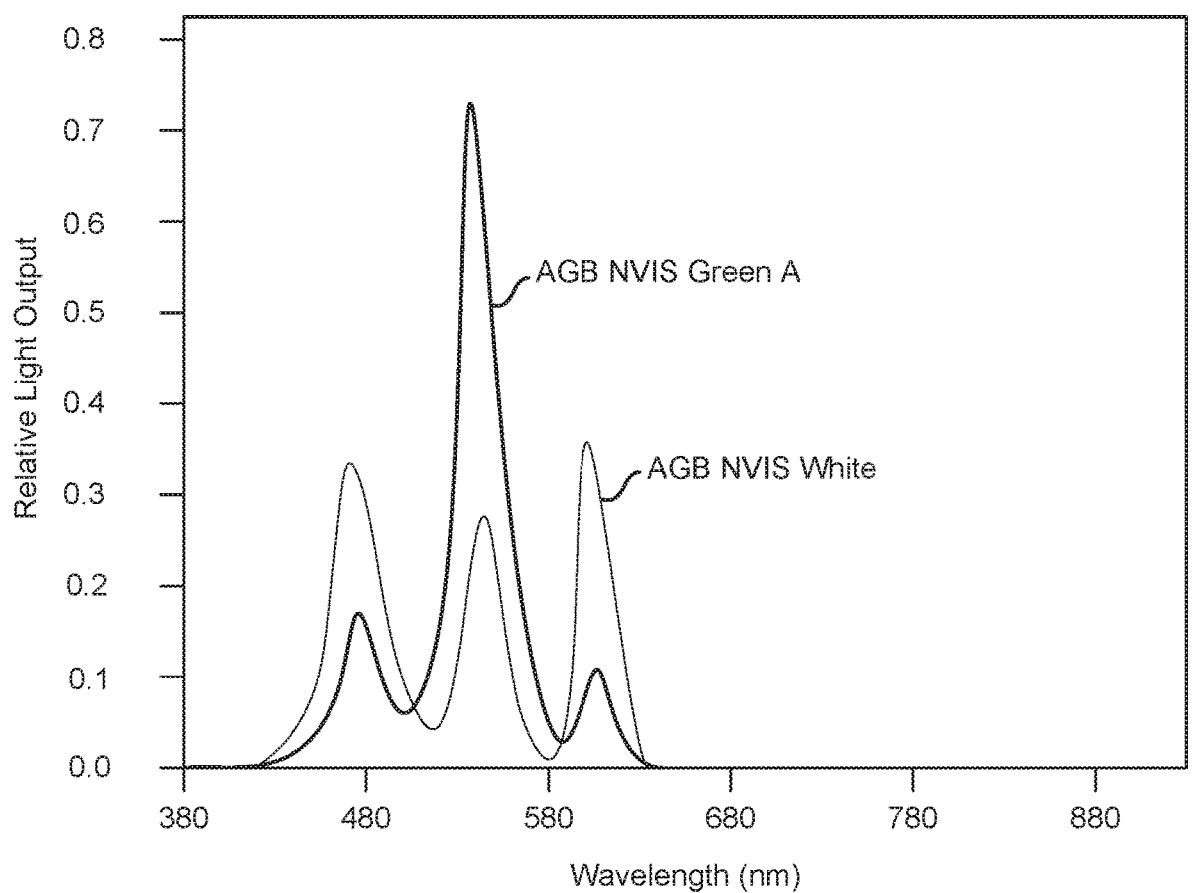
FIG. 4 illustrates a plot of example spectral distributions achievable by a multi-mode NVIS-compatible lighting system, in accordance with various embodiments.

FIG. 4 illustrates a plot of examples of spectral distributions of NVIS-compliant lights. In various embodiments, multi-mode NVIS-compatible lighting system 100 may output lights similar to those depicted in FIG. 4. For example, multi-mode NVIS-compatible lighting system 100 may be capable of outputting a color corresponding to NVIS Green A and NVIS White, in various embodiments. In various embodiments, NVIS Green A may comprise a dominant wavelength between approximately 530 nm and approximately 540 nm. NVIS White may comprise any wavelength between approximately 390 nm and 700 nm.

Figure 5:
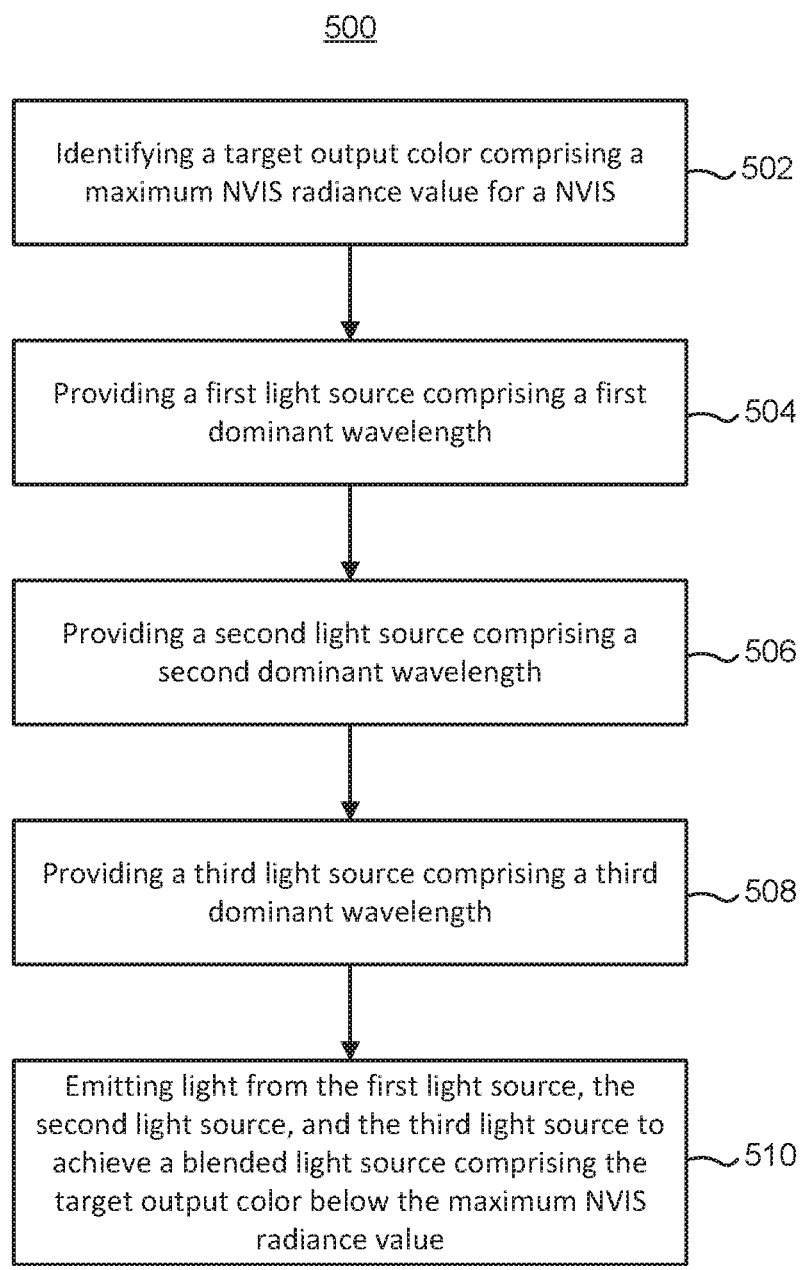
FIG. 5 illustrates a block diagram of a method of producing a target output color for a NVIS, in accordance with various embodiments.

A block diagram illustrating a method of producing a target output color for a NVIS is illustrated in FIG. 5, in accordance with various embodiments. The method may comprise identifying a target output color comprising a maximum NVIS radiance value for a NVIS (step 502). The method may further comprise providing a first light source comprising a first dominant wavelength (step 504). The method may further comprise providing a second light source comprising a second dominant wavelength (step 506). The method may further comprise providing a third light source comprising a third dominant wavelength (step 508). The method may further comprise emitting light from the first light source, the second light source, and the third light source to achieve a blended light source comprising the target output color below the maximum NVIS radiance value (step 510).

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the disclosure. The scope of the disclosure is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C. Different cross-hatching is used throughout the figures to denote different parts but not necessarily to denote the same or different materials.

Methods, systems, and articles media are provided herein. In the detailed description herein, references to "one embodiment", "an embodiment", "various embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f) unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A night vision imaging system (NVIS) lighting system, comprising:
    a frame comprising:
        a first light source comprising a first dominant wavelength;
        a second light source adjacent to the first light source, the second light source comprising a second dominant wavelength different from the first dominant wavelength;
        a third light source adjacent to the second light source, the third light source comprising a third dominant wavelength different from the first dominant wavelength and the second dominant wavelength; and
    a diffuser mounted to the frame and encasing the first light source, the second light source, and the third light source, the diffuser including a semi-opaque material configured to evenly distribute light from the first light source, the second light source, and the third light source, wherein:
        the NVIS lighting system is configured to emit a first target output color by blending the first light source, the second light source, and the third light source,
        the NVIS lighting system is configured to emit a second target output color by blending the first light source, the second light source, and the third light source, and
        the second target output color is different than the first target output color.

2. The NVIS lighting system of claim 1, wherein the first light source and the second light source are each below a threshold radiance value.

3. The NVIS lighting system of claim 2, wherein the first light source comprises approximately 34% of the first target output color, the second light source comprises approximately 28% of the first target output color, and the third light source comprises approximately 38% of the first target output color.

4. The NVIS lighting system of claim 3, wherein the first light source comprises approximately 17% of the second target output color, the second light source comprises approximately 73% of the second target output color, and the third light source comprises approximately 10% of the second target output color.

5. The NVIS lighting system of claim 1, wherein the first dominant wavelength of the first light source corresponds to a blue color, the second dominant wavelength of the second light source corresponds to a green color, and the third dominant wavelength of the third light source corresponds to an amber color.

6. The NVIS lighting system of claim 1, wherein the first target output color comprises a green color comprising a dominant wavelength of between approximately 530 nm and approximately 540 nm.

7. The NVIS lighting system of claim 1, wherein the second target output color comprises a white color comprising any wavelength between approximately 390 nm and approximately 700 nm.

8. A light-emitting diode (LED) array, comprising:
a first LED;
a second LED; and
a third LED, wherein:
the LED array is configured to be encased within a diffuser, the diffuser including a semi-opaque material configured to evenly distribute light from the first LED, the second LED, and the third LED,
the first LED comprises a first dominant wavelength,
the second LED comprises a second dominant wavelength different from the first dominant wavelength,
the third LED comprises a third dominant wavelength different from the first dominant wavelength and the second dominant wavelength,
the LED array is configured to emit a first target output color by blending the first LED, the second LED, and the third LED,
the LED array is configured to emit a second target output color by blending the first LED, the second LED, and the third LED, and
the second target output color is different than the first target output color.

9. The LED array of claim 8, wherein the first LED, second LED, and the third LED are aligned in a column, the second LED being situated between the first LED and the third LED.

10. The LED array of claim 8, wherein the first LED, second LED, and the third LED are aligned in a first row, the second LED being situated between the first LED and the third LED.

11. The LED array of claim 10, further comprising a fourth LED, a fifth LED, and a sixth LED, wherein the fourth LED, the fifth LED, and the sixth LED are aligned in a second row adjacent to the first LED, the second LED, and the third LED.

12. The LED array of claim 11, wherein the fourth LED is situated between the fifth LED and the sixth LED.

13. The LED array of claim 8, wherein the first dominant wavelength corresponds to a blue color, the second dominant wavelength corresponds to a green color, and the third dominant wavelength corresponds to an amber color.

14. The LED array of claim 8, wherein the first target output color comprises a green color comprising a dominant wavelength of between approximately 530 nm and approximately 540 nm.

15. The LED array of claim 8, wherein the second target output color comprises a white color comprising any wavelength between approximately 390 nm and approximately 700 nm.

16. A method of producing target output colors for a night vision imaging system (NVIS), comprising:
blending light from a first light source, a second light source, and a third light source to generate the first target output color, the first light source comprising a first dominant wavelength, the second light source comprising a second dominant wavelength, the third light source comprising a third dominant wavelength; and
blending light from the first light source, the second light source, and the third light source to generate the second target output color.

17. The method of claim 16, wherein the first dominant wavelength corresponds to a blue color, the second dominant wavelength corresponds to a green color, and the third dominant wavelength corresponds to an amber color.

* * * * *